(12) United States Patent
Son (10) Patent No.: US 7,612,380 B2
(45) Date of Patent: Nov. 3, 2009

(54) LIGHT EMITTING DEVICE AND METHOD OF MANUFACTURING THE SAME

(75) Inventor: Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 55 days.

(21) Appl. No.: 11/681,514

(22) Filed: Mar. 2, 2007

(65) Prior Publication Data

US 2007/0215882 A1 Sep. 20, 2007

(30) Foreign Application Priority Data

Mar. 6, 2006 (KR) ................ 10-2006-0021114

(51) Int. Cl.
*H01L 33/00* (2006.01)
(52) U.S. Cl. .................. 257/79; 257/E33.001
(58) Field of Classification Search .......... 257/79, 257/94, 95, 98, 99, 100, 101, 102, 103, E33.001–E33.077; 438/22, 26–35, 38, 39, 40, 42, 43
See application file for complete search history.

(56) References Cited

U.S. PATENT DOCUMENTS

| 5,779,924 A | * | 7/1998 | Krames et al. | ............... 216/24 |
| 6,008,067 A | * | 12/1999 | Ramdani et al. | ............... 438/46 |
| 6,617,056 B1 | * | 9/2003 | Hara et al. | .................. 428/697 |
| 2002/0056836 A1 | * | 5/2002 | Sawazaki et al. | ............... 257/13 |
| 2004/0104395 A1 | * | 6/2004 | Hagimoto et al. | ............... 257/79 |
| 2005/0212002 A1 | * | 9/2005 | Sanga et al. | .................. 257/96 |

FOREIGN PATENT DOCUMENTS

KR 10-2004-0094700 5/2006

* cited by examiner

*Primary Examiner*—Sue Purvis
*Assistant Examiner*—Kevin Quinto
(74) *Attorney, Agent, or Firm*—Saliwanchik, Lloyd & Saliwanchik (57) ABSTRACT

A light emitting device and a method of manufacturing the same are provided. The light emitting device comprises a first conductive type lower semiconductor layer, a current diffusion layer, a first conductive type upper semiconductor layer, an active layer, and a second conductive type semiconductor layer. The current diffusion layer is formed on the first conductive type lower semiconductor layer. The first conductive type upper semiconductor layer is formed on the current diffusion layer. The active layer is formed on the first conductive type upper semiconductor layer. The second conductive type semiconductor layer is formed on the active layer.

5 Claims, 6 Drawing Sheets

LIGHT EMITTING DEVICE AND METHOD OF MANUFACTURING THE SAME

CROSS REFERENCE TO RELATED APPLICATION

The present application claims priority under 35 U.S.C. 119 to Korean Patent Application No. 10-2006-021114 filed on Mar. 6, 2006, which is hereby incorporated by reference in its entirety.

BACKGROUND OF THE INVENTION

A nitride semiconductor light emitting device may have a light emitting region containing infrared, blue, and green regions. An example of a nitride semiconductor light emitting device is a GaN-based nitride semiconductor light emitting device.

A GaN-based nitride semiconductor light emitting device is formed with a buffer layer on a sapphire substrate, and an n-GaN layer and a p-GaN layer are formed on the buffer layer.

An electrode layer is formed on the n-GaN layer and the p-GaN layer. In operation, a voltage is applied thereto so that light is generated from the active layer.

In a nitride semiconductor light emitting device, because the sapphire substrate and the n-GaN layer have different lattice constants, dislocation of the boundary surfaces of the sapphire substrate and the n-GaN layer occurs.

In order to reduce the difference of the lattice constants between the sapphire substrate and the n-GaN layer, a buffer layer is formed on the sapphire substrate.

However, even when the n-GaN layer is formed on the buffer layer, there is a limit to the amount by which dislocation spreading to the n-GaN layer can be reduced.

BRIEF SUMMARY

An embodiment of the present invention is related to a nitride semiconductor light emitting device and a manufacturing method thereof that addresses and/or substantially obviates one or more problems due to limitations and disadvantages of the related art.

An embodiment of the present invention provides a nitride semiconductor light emitting device and a manufacturing method thereof capable of reducing the spread of dislocation occurring on a substrate.

An embodiment of the present invention provides a nitride semiconductor light emitting device and a manufacturing method thereof capable of uniformly supplying carriers.

An embodiment of the present invention provides a nitride semiconductor light emitting device and a manufacturing method thereof having strengthened electrostatic discharge (ESD) properties.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

An embodiment of the present invention provides a light emitting device comprising: a first conductive lower semiconductor layer; a current diffusion layer on the first conductive lower semiconductor layer; a first conductive upper semiconductor layer on the current diffusion layer; an active layer on the first conductive upper semiconductor layer; and a second conductive semiconductor layer on the active layer.

An embodiment of the present invention provides a light emitting device comprising: a substrate; a first conductive lower semiconductor layer on the substrate; a current diffusion layer on the first conductive lower semiconductor layer; a first conductive upper semiconductor layer on the current diffusion layer; an active layer on the first conductive upper semiconductor layer; and a second conductive semiconductor layer on the active layer.

An embodiments of the present invention provides a method of manufacturing a light emitting device, comprising: forming a first conductive lower semiconductor layer on a substrate; forming a current diffusion layer on the first conductive lower semiconductor layer; forming a first conductive upper semiconductor layer on the current diffusion layer; forming an active layer on the first conductive upper semiconductor layer; and forming a second conductive semiconductor layer on the active layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Reference will now be made in detail to the preferred embodiments of the present invention, examples of which are illustrated in the accompanying drawings. However, the present invention is not limited to the embodiments provided herein, and may include alternate embodiments that lie within the scope of other regressive inventions or the present invention through the inclusion of added, altered, and deleted elements. Wherever possible, the same reference numbers will be used throughout the drawings to refer to the same or like parts.

In the descriptions of the embodiments, when one element is said to be formed on or under another element, the first element may be formed directly above or under the second element so that the two elements are in contact, or the first element may be indirectly formed on the second element with a third element interposed between the first and second elements.

Figure 1:
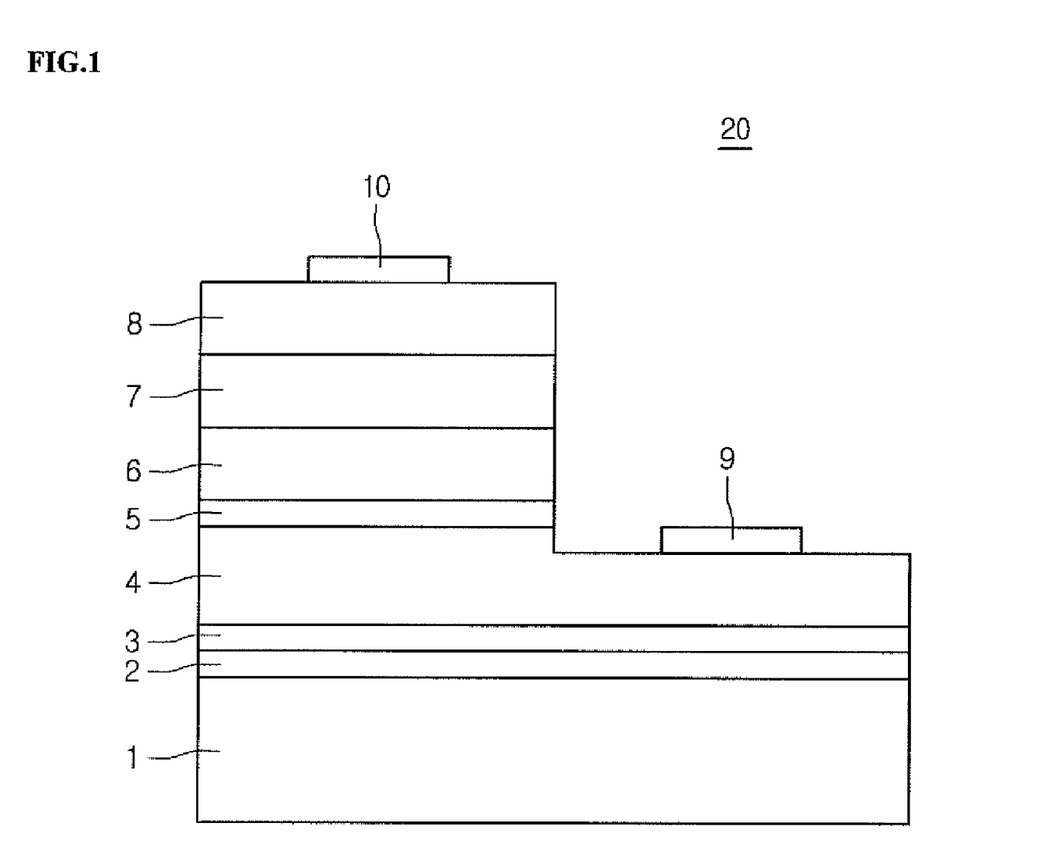
FIGS. 1 through 3 are sectional views showing light emitting devices according to embodiments of the present invention.
Figure 2:
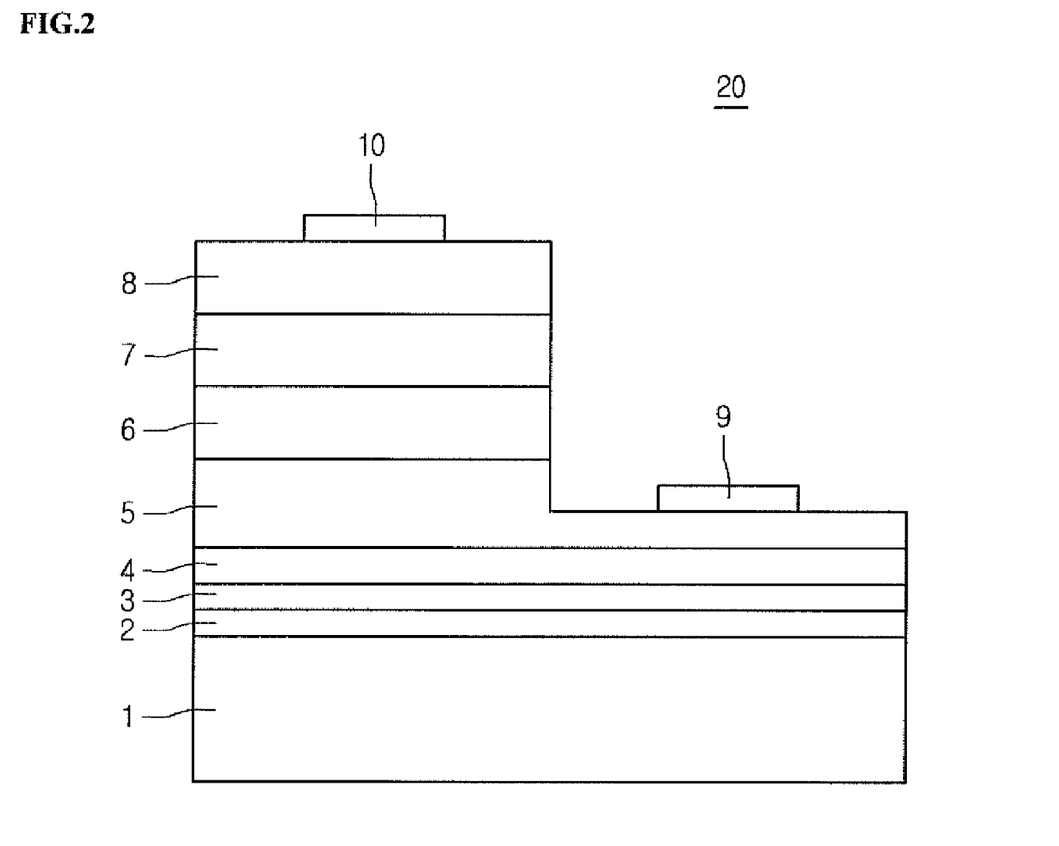
Figure 3:
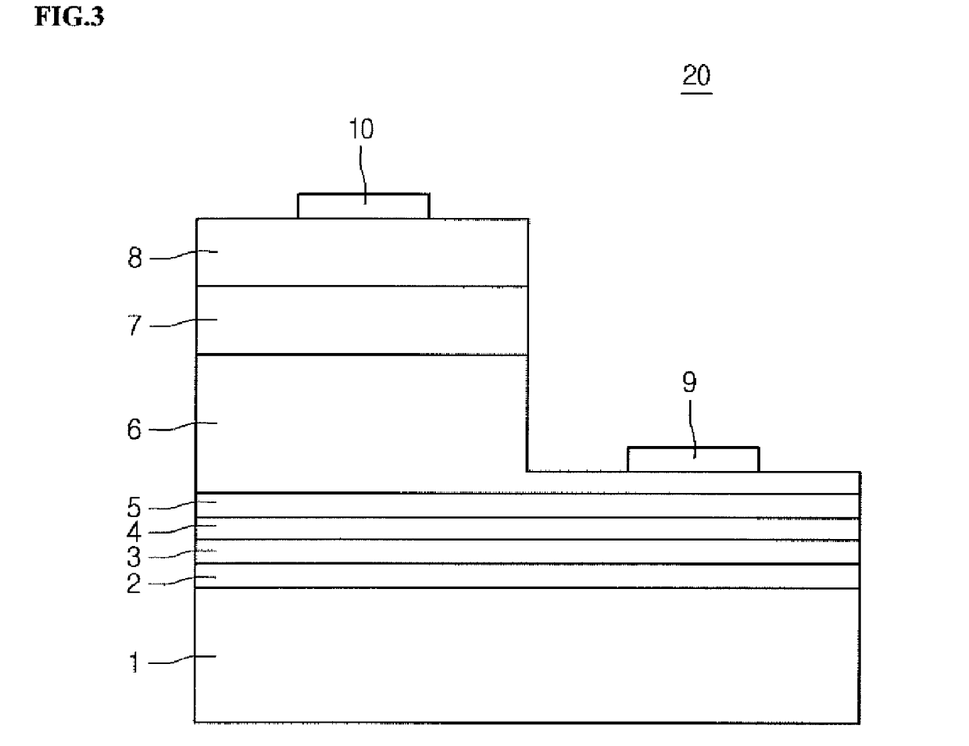

FIGS. 1 through 3 are sectional views showing nitride semiconductor light emitting devices according to embodiments of the present invention.

Referring to FIG. 1, a first embodiment of a nitride semiconductor light emitting device 20 includes a substrate 1 on which a buffer layer 2 and an undoped nitride layer 3 are formed. A first conductive type lower nitride semiconductor layer 4, a current diffusion layer 5, and a first conductive type upper nitride semiconductor layer 6 are formed on the undoped nitride layer 3.

Also, an active layer 7 and a second conductive type nitride semiconductor layer 8 are formed on the first conductive type upper nitride semiconductor layer 6.

A first electrode 9 is formed on the first conductive type lower nitride semiconductor layer 4, and a second electrode 10 is formed on the second conductive type nitride semiconductor layer 8

Referring to FIG. 2, a second embodiment of a nitride semiconductor light emitting device 20 includes a buffer layer 2 and an undoped nitride layer 3 formed on a substrate 1, and a first conductive type lower nitride semiconductor layer 4, a current diffusion layer 5, and a first conductive type upper nitride semiconductor layer 6 formed on the undoped nitride layer 3.

Also, an active layer 7 and a second conductive type nitride semiconductor layer 8 are formed on the first conductive type upper nitride semiconductor layer 6.

The first electrode 9 is formed on the current diffusion layer 5, and the second electrode 10 is formed on the second conductive type nitride semiconductor layer 8.

Referring to FIG. 3, a third embodiment of a nitride semiconductor light emitting device 20 includes a buffer layer 2 and an undoped nitride layer 3 formed on a substrate 1, and a first conductive type lower nitride semiconductor layer 4, a current diffusion layer 5, and a first conductive type upper nitride semiconductor layer 6 formed on the undoped nitride layer 3.

Also, an active layer 7 and a second conductive type nitride semiconductor layer 8 are formed on the first conductive type upper nitride semiconductor layer 6.

A first electrode 9 is formed on the first conductive type upper nitride semiconductor layer 6, and a second electrode 10 is formed on the second conductive type nitride semiconductor layer 8.

Referring again to FIGS. 1 through 3, the substrate 1 may be formed of sapphire, SiC, or Si.

The buffer layer 2 is for reducing the difference of the lattice constant between the substrate 1 and the first conductive type lower nitride semiconductor layer 4, and may be selected and formed of an AlInN structure, an InGaN/GaN superlattice structure, an $In_xGa_{1-x}N$/GaN stacked structure, or an $Al_xIn_yGa_{1-x-y}N$/$In_xGa_{1-x}N$/GaN stacked structure.

The undoped nitride layer 3 may be formed of an undoped GaN layer.

The first conductive type lower nitride semiconductor layer 4 may be formed of an n-GaN layer that includes an n-type dopant. The n-GaN layer may be doped with Si to lower the driving voltage thereof.

The current diffusion layer 5 may be formed of indium tin oxide (ITO). Also, the current diffusion layer 5 may be formed of a layer including at least one of Co, W, and Fe.

The current diffusion layer 5 is for allowing the uniform flow of current to the first conductive type lower nitride semiconductor layer 4 and the first conductive type upper nitride semiconductor layer 6, and may have a lower resistance than the first conductive type lower nitride semiconductor layer 4 and the first conductive type upper nitride semiconductor layer 6 in order to accelerate the flow of electrons.

The first conductive type upper nitride semiconductor layer 6 may be formed of an n-GaN layer including an n-type dopant.

The active layer 7 may be formed as a single quantum well structure or a multi-quantum well structure. In one embodiment example, the active layer may be formed of an InGaN well layer and an InGaN (or GaN) barrier layer structure.

The second conductive type nitride semiconductor layer 8 may be formed of a p-GaN layer including a p-type dopant, and magnesium may be used as a dopant in the p-GaN layer.

The first electrode 9 can be electrically connected to the first conductive type nitride semiconductor layer 4, the current diffusion layer 5, or the first conductive type upper nitride semiconductor layer 6, for applying a voltage thereto, and the second electrode can be electrically connected to the second conductive type nitride semiconductor layer 8 for applying a voltage thereto.

Figure 4A:
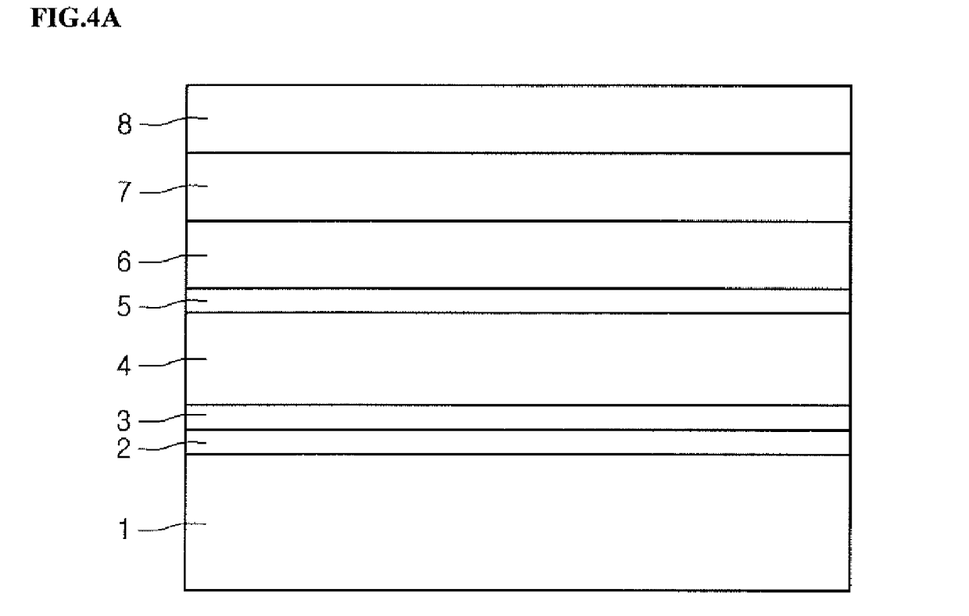
FIGS. 4A through 4C are sectional views showing a manufacturing method of a light emitting device according to an embodiment of the present invention.
Figure 4B:
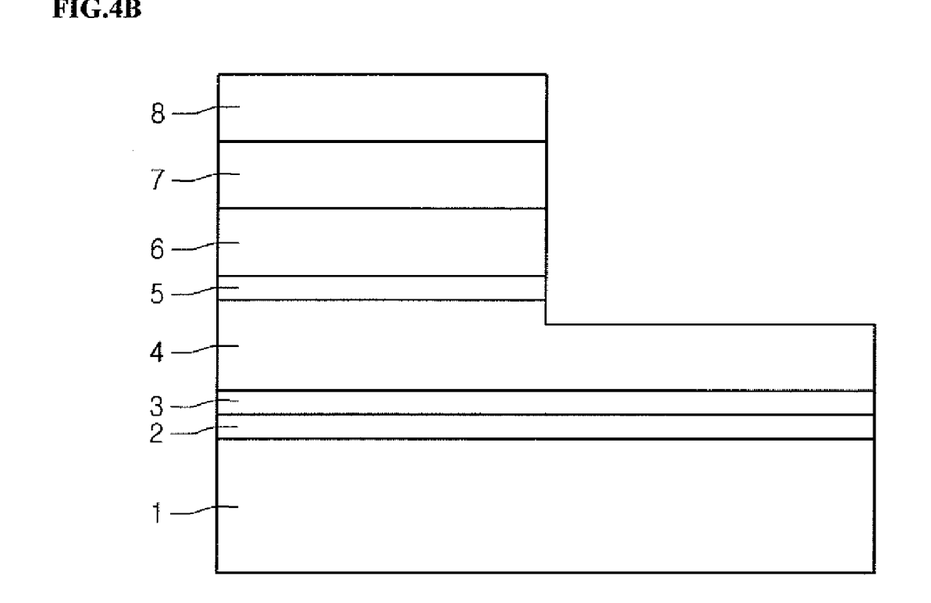
Figure 4C:
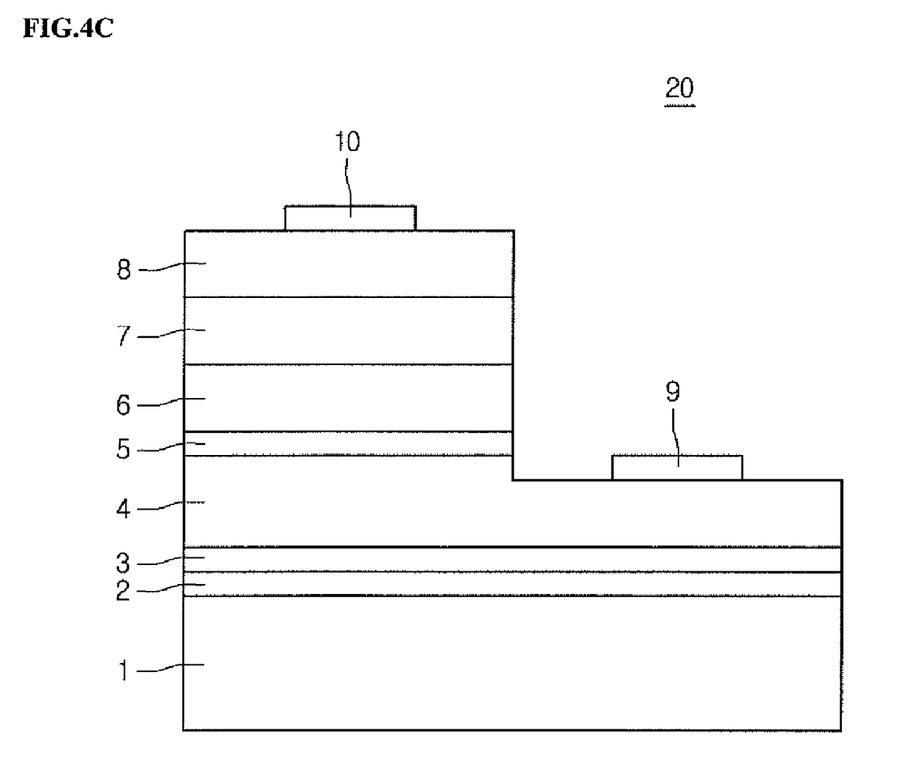

FIGS. 4A through 4C are sectional views showing a manufacturing method of a nitride semiconductor light emitting device according to an embodiment of the present invention.

Referring to FIGS. 4A through 4C, a buffer layer 2 is formed on a substrate 1. The buffer layer 2 may be formed as a multi-layer.

For example, the substrate 1 may be installed in a metal organic chemical vapor deposition (MODVD) chamber or a molecular beam epitaxy (MBE) chamber, whereupon a silicon layer may be formed by growing silicon of approximately 10 Å on the substrate 1 in an atmosphere of 500-600° C. and silane ($SiH_4$) gas. An InN layer can then be formed on the silicon layer.

In addition, an AlN layer with a predetermined ratio of Al to N can be grown on the InN layer in an atmosphere of 1000° C. using trimethylaluminum (TMAl) and ammonia ($NH_3$).

Accordingly, the buffer layer 2 can be formed as a multi-layer including at least one of a silicon layer, an InN layer, and an AlN layer.

Then, an undoped nitride layer 3 is formed on the buffer layer 2.

The undoped nitride layer 3 can be formed of an undoped GaN layer with a predetermined thickness on the buffer layer 2 in an atmosphere of 1500° C. by supplying $NH_3$ and tri-metal gallium (TMGa).

Next, the first conductive type lower nitride semiconductor layer 4 is formed on the undoped nitride layer 3.

The first conductive type lower nitride semiconductor layer 4 can be formed by growing an n-GaN layer of a predetermined thickness by supplying $NH_3$, tri-metal gallium (TMGa), and a silane gas with an n-type dopant such as Si.

Then, the current diffusion layer 5 is formed on the first conductive type lower nitride semiconductor layer 4.

The current diffusion layer 5 may be formed of ITO at a thickness of around 1-100,000 Å, and may be formed of a layer including at least one of Co, W, and Fe with a thickness of around 1-100,000 Å.

The current diffusion layer 5 can be grown, for example, using metal organic chemical vapor deposition (MOCVD), molecular beam epitaxy (MBE), sputtering, or e-beam equipment.

In an embodiment example, the first conductive type lower nitride semiconductor layer 4 may be formed using MOCVD equipment, and the current diffusion layer 5 may be formed using MBE, sputtering, or e-beam equipment.

Because the current diffusion layer 5 may be formed at a high temperature of approximately 1000° C., the coupling of the ITO cracks, and the indium and tin disposed on the surface of the current diffusion layer 5 mixes as impurities in the first conductive type upper nitride semiconductor layer 6 during the process of forming the first conductive type upper nitride semiconductor layer 6.

When the indium and the tin mixes as impurities in the first conductive type upper nitride semiconductor layer 6, the dislocation propagation to the first conductive type upper nitride semiconductor layer 6 is blocked.

Also, the current diffusion layer 5 allows the uniform spreading of current over the first conductive type lower nitride semiconductor layer 4 and the first conductive type upper nitride semiconductor layer 6, so that the carrier concentration is increased and the operating voltage is reduced. Therefore, the life of the light emitting device can be increased, and its reliability can also be increased.

Furthermore, the current diffusion layer 5 can strengthen ESD characteristics. That is, when a high reverse voltage is applied, the current diffusion layer 5 can quickly spread the reverse voltage to prevent damage to the active layer 7 caused by the reverse voltage.

Next, referring again to FIG. 4A, the first conductive type upper nitride semiconductor layer 6 is formed on the current diffusion layer 5.

Indium and tin on the surface of the current diffusion layer 5 may mix as impurities in the first conductive type upper nitride semiconductor layer 6.

The first conductive type upper nitride semiconductor layer 6, like the first conductive type lower nitride semiconductor layer 4, may be formed of an n-GaN layer grown to a thickness of 1-10,000 Å using a silane gas with an n-type dopant such as $NH_3$, TMGa, or Si.

The first conductive type upper nitride semiconductor layer 6 may be grown such that it has a different resistance, carrier mobility, and carrier concentration than the first conductive type lower nitride semiconductor layer 4.

For example, the first conductive type upper nitride semiconductor layer 6 may be doped regionally at different densities with Si. In addition, the first conductive type upper nitride semiconductor layer 6 may be doped with Si and have doping densities that varied progressively.

That is, the first conductive type upper nitride semiconductor layer 6 can be doped with Si to have a carrier concentration of more than $1 \times 10^{19}$ ions/cm$^3$ near the current diffusion layer 5, where the doping density becomes progressively less towards the upper surface of the first conductive type upper nitride semiconductor layer 6, such that the first conductive type upper nitride semiconductor layer 6 has a carrier concentration of below $3 \times 10^{18}$ ions/cm$^3$ near the active layer 7.

Thus, the first conductive type upper nitride semiconductor layer 6 has a varying dopant density in order to prevent regional dislocation and reduce dynamic resistance of electron diffusion according to changes in current and voltage. Also, the threshold energy for the flow of electrons is reduced to increase power efficiency.

Furthermore, the first conductive type upper nitride semiconductor layer 6 can be formed by controlling its growth rate in stages.

For example, the n-GaN layer for the first conductive type upper nitride layer 6 may first be formed at a growth rate of 0.0001-1 µm/hour at a temperature range of 100-800° C., after which it is formed at a growth rate of 1-3 µm/hour at a temperature range of 800-1,100° C.

Next, the active layer 7 may be formed of InGaN.

The active layer 7 may be formed of an InGaN layer with a thickness of 120 Å-1,200 Å by using nitrogen as a carrier gas and supplying $NH_3$, TMGa, and TMIn.

Here, the active layer 7 may be formed as a plurality of stacked layers of InGaN with each element in a mol ratio.

Also, a barrier layer may be formed in the active layer 7, and a p-type cladding layer for carrier confinement may be formed between the active layer 7 and the second conductive type nitride semiconductor layer 8.

After forming the active layer 7 the second conductive type nitride semiconductor layer 8 can be formed on the active layer 7.

The second conductive type nitride semiconductor layer 8 may be formed of a p-GaN layer mixed with a p-type dopant.

The p-GaN layer may include a magnesium impurity, and after the p-GaN layer is formed, it can be heat treated at a temperature of 500-900° C., so that the hole density of the p-GaN layer is maximized.

Referring to FIG. 4B, after the above semiconductor layer is formed, a portion of the first conductive type lower nitride semiconductor layer 4, the current diffusion layer 5, the first conductive type upper nitride semiconductor layer 6, the active layer 7, and the second conductive type nitride semiconductor layer 8 may be selectively removed to expose the first conductive type lower nitride semiconductor layer 4.

Additionally, as shown in FIG. 4C, a first electrode 9 can be formed on the first conductive type lower nitride semiconductor layer 4, and a second electrode 10 can be formed on the second conductive type nitride semiconductor layer 8.

In the embodiment shown in FIG. 2, the first electrode 9 may be formed on the current diffusion layer 5 by selectively removing a portion from the second conductive type nitride semiconductor layer 8 to the current diffusion layer 5, in order to expose the current diffusion layer 5.

In another embodiment, as shown in the embodiment in FIG. 3, a portion of the second conductive type nitride semiconductor layer 8 to the second conductive type upper nitride semiconductor layer 6 may be selectively removed to expose the second conductive type upper nitride semiconductor layer 6, and form the first electrode 9 on the second conductive type upper nitride semiconductor layer 6.

The nitride semiconductor light emitting device formed using the above method radiates light when power is applied through the first electrode 9 and the second electrode 10, causing the re-coupling of electrons and holes in the active layer 7.

Figure 5A:
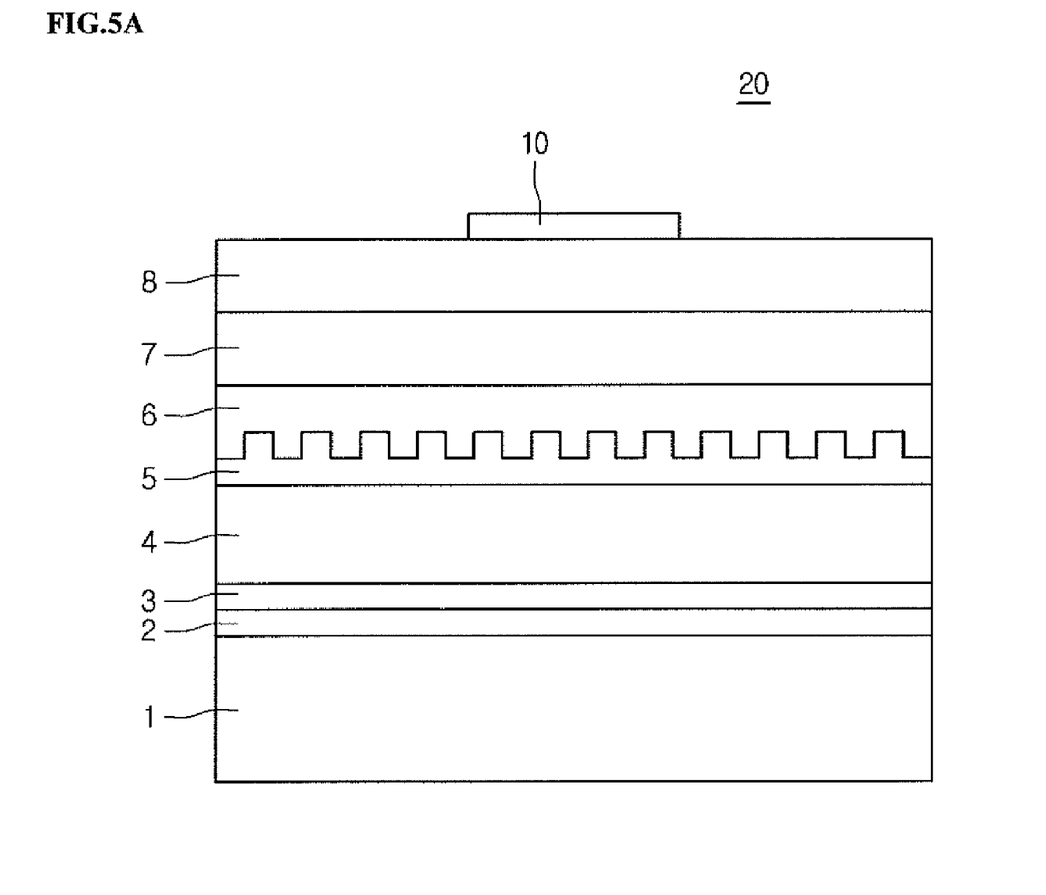
FIGS. 5A and 5B are sectional views showing a light emitting device according to an embodiment of the present invention.
Figure 5B:
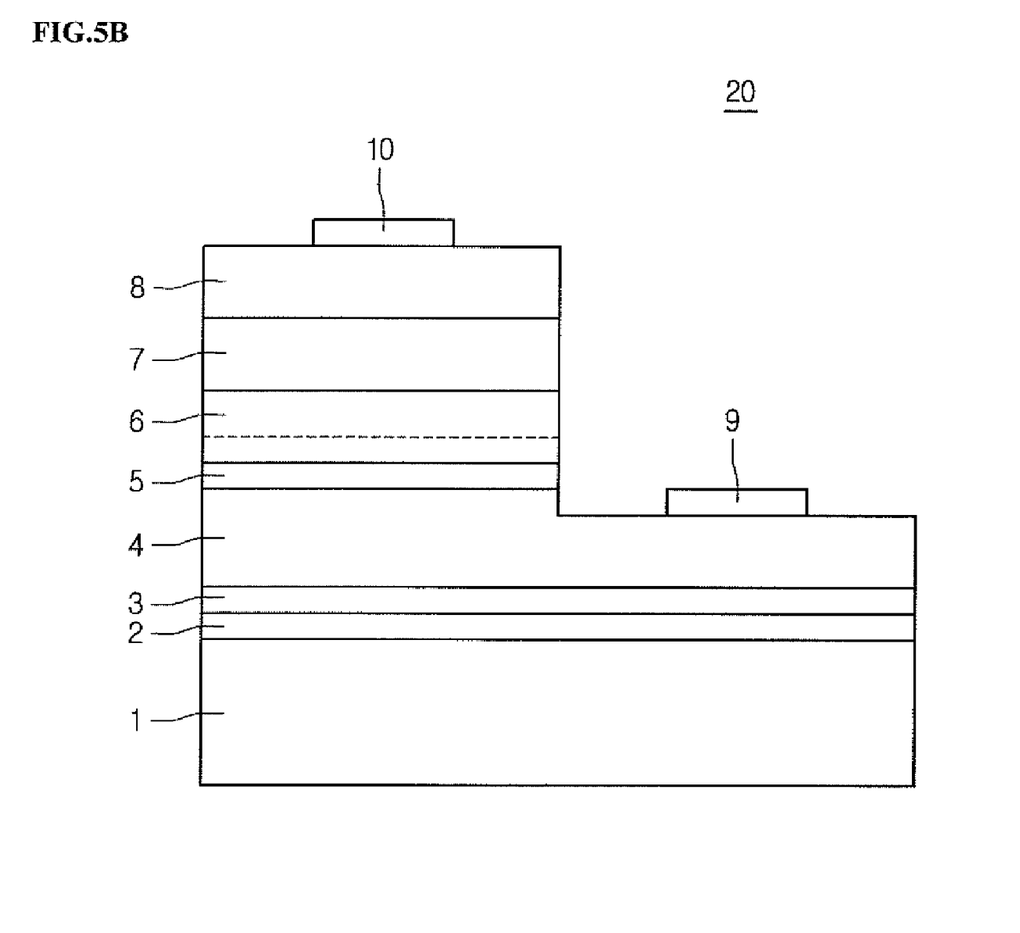

FIGS. 5A and 5B are sectional views showing a nitride semiconductor light emitting device according to a fourth embodiment of the present invention.

Referring to FIGS. 5A and 5B, the current diffusion layer 5 may be formed having an uneven type surface.

In the sectional view shown in FIG. 5A, recesses formed with right angles are shown; however, the recesses may have semicircular, trapezoidal, concave, convex, or other shapes.

The right-angled recesses in FIG. 5A are elongated recesses in striped shapes, and the dotted line in FIG. 5B depicts the uppermost end of the current diffusion layer 5.

To form the uneven surface of the current diffusion layer 5, the upper surface of the current diffusion layer 5 can be chemically removed after forming the current diffusion layer 5 on the first conductive type lower nitride semiconductor layer 4. For example, a mask may be formed on the upper surface of the current diffusion layer 5, after which etching is used to selectively form an uneven surface.

Thus, because the upper surface of the current diffusion layer 5 is uneven, the advantages of the current diffusion layer 5 are more pronounced.

Any reference in this specification to "one embodiment", "an embodiment", "an exemplary embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a substrate;
    a first conductive type lower semiconductor layer on the substrate;
    a buffer layer and an undoped nitride layer formed between the substrate and the first conductive type lower semiconductor layer;
    a current diffusion layer on the first conductive type lower semiconductor layer;
    a first conductive type upper semiconductor layer on the current diffusion layer;
    an active layer on the first conductive type upper semiconductor layer; and
    a second conductive type semiconductor layer on the active layer.

2. The light emitting device according to claim 1, further comprising a first electrode on one of the first conductive type lower semiconductor layer, the current diffusion layer, or the first conductive type upper semiconductor layer.

3. The light emitting device according to claim 1, further comprising a second electrode on the second conductive type semiconductor layer.

4. The light emitting device according to claim 1, wherein the current diffusion layer comprises at least one of ITO, Co, W, or Fe.

5. The light emitting device according to claim 1, wherein the current diffusion layer is formed with an uneven surface.

* * * * *